（12）United States Patent
Suzuki (10) Patent No.: US 7,679,003 B2
(45) Date of Patent: Mar. 16, 2010

(54) CARRIER TAPE (75) Inventor: Yuzo Suzuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/438,441

(22) Filed: May 23, 2006

(65) Prior Publication Data

US 2006/0267191 A1 Nov. 30, 2006

(30) Foreign Application Priority Data

May 24, 2005 (JP) ............................. 2005-150430

(51) Int. Cl.
H05K 1/11 (2006.01)
H01R 12/04 (2006.01)
(52) U.S. Cl. ...................... 174/261; 174/254
(58) Field of Classification Search ................ 174/254, 174/260, 261
See application file for complete search history.

(56) References Cited

U.S. PATENT DOCUMENTS 4,949,155 A * 8/1990 Tajima et al. ............... 174/255
4,977,441 A * 12/1990 Ohtani et al. ................ 257/48
5,110,664 A * 5/1992 Nakanishi et al. ......... 428/195.1
5,448,451 A * 9/1995 Takubo et al. ............... 361/749
6,054,763 A * 4/2000 Kashiwada .................. 257/723
7,164,460 B2 * 1/2007 Hagiwara .................... 349/149
7,231,711 B2 * 6/2007 Hwang et al. ................. 29/825

FOREIGN PATENT DOCUMENTS

JP 7-7040 A 1/1995
JP 2003-318232 11/2003

* cited by examiner

Primary Examiner—Ishwarbhai B Patel
(74) Attorney, Agent, or Firm—Sughrue Mion, PLLC (57) ABSTRACT A carrier tape according to the present invention includes a plurality of tape carrier packages provided at a regular interval on a lengthy insulating tape, a first and a second integrated circuit device respectively and mounted to each of the plurality of tape carrier packages. Further, a connecting line electrically short-circuits only between one of terminals for the first integrated circuit device and one of terminals for the second integrated circuit device. This configuration prevents the integrated circuit devices from being damaged by discharged static electricity as well as allows to conduct a performance test on the integrated circuit devices such as checking for input/output of a signal by applying a probe pin to an input or output pin.

12 Claims, 7 Drawing Sheets

CARRIER TAPE

BACKGROUND OF THE INVENTION

1. Field of the Invention

The present invention relates to a carrier tape, and particularly to a carrier tape having a plurality of tape carrier packages provided at a regular interval on a lengthy insulating tape and a plurality of integrated circuit devices mounted to each of the plurality of tape carrier packages.

2. Description of the Related Art

A method of implementing an integrated circuit device to a tape carrier package is widely used in recent years as an implementation method of an integrated circuit device. With its flexibility and capability to handling fine pitch, a tape carrier package is currently a primary method of implementing an integrated circuit device that supplies driving signal for LCD (Liquid Crystal Display) panel.

Such type carrier packages are manufactured on a lengthy carrier tape and shipped for a user to place to a chip mounter. The chip mounter punches out a tape carrier package one by one from a carrier tape and implements the punched tape carrier packages to a liquid crystal display panel.

In processes from implementing an integrated circuit device on a patterned insulating tape to a process of punching tape carrier packages out from a carrier tape, a potential difference could be generated between integrated circuit devices placed adjacent to each other due to an electrification by friction between components, thereby causing to damage integrated circuit devices by discharged static electricity.

To prevent integrated circuit devices from being damaged by electrostatic discharge, a carrier tape is suggested in which all plurality of input terminals formed on each tape carrier package are electrically short-circuited by the same potential lines, as well as electrically short-circuiting all plurality of output terminals formed on each tape carrier package by the same potential lines (for example in Japanese Unexamined Patent Publication No. 2003-318232, FIG. 1 and paragraph [0027]).

However it has been discovered that in the technique disclosed in Japanese Unexamined Publication No. 2003-318232, all plurality of input and output terminals are short-circuited by the same potential lines, and it is therefore not possible to perform a performance test on integrated circuit device such as checking input/output of a signal by applying a probe pin to an input or output pin until a tape carrier package is punched out from a carrier tape.

SUMMARY OF THE INVENTION

According to an aspect of the present invention, there is provided a carrier tape that includes at least one tape carrier package provided on an insulating tape, first and second integrated devices provided to the tape carrier package, each of the first and second integrated devices including a plurality of terminals, a first one of the terminals of the first integrated circuit device being electrically connected to a first one of the terminals of second integrated circuit device, a second one of the terminals of the first integrated circuit device being not electrically connected to a second one of the terminal of second integrated circuit device.

The configuration described in the foregoing prevents integrated circuit devices from being damaged by discharged static electricity during a process of manufacturing tape carrier packages, as well as allows to conduct a performance test on integrated circuit device for example by applying a probe pin between terminals to check for input/output of a signal.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A configuration of a carrier tape according to a first embodiment of the present invention is described hereinafter in detail with reference to the drawings.

Figure 1:
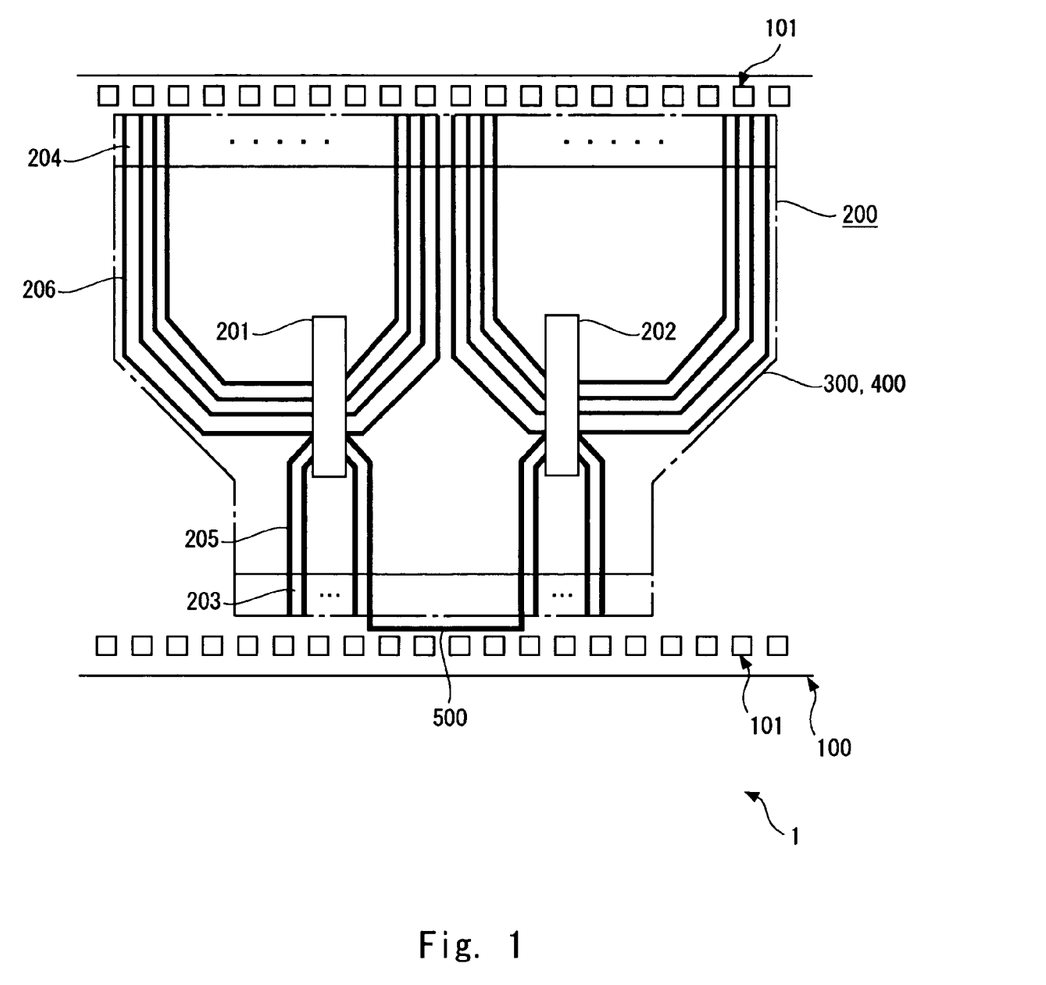
FIG. 1 is a plan view showing a configuration of a carrier tape according to a first embodiment of the present invention.

FIG. 1 is a plan view showing a configuration of a carrier tape according to the first embodiment of the present invention.

As shown in FIG. 1, a carrier tape 1 is comprised of a plurality of tape carrier packages 200 provided at a regular interval on a lengthy insulating tape 100.

As illustrated in FIG. 1, a plurality of sprocket holes 101 are formed at a regular interval along a direction to which the insulating tape 100 extends on both sides of the insulating tape 100. The insulating tape 100 is formed by flexible material such as polyimide.

The plurality of sprocket holes 101 are used to feed the carrier tape 100 intermittently, for example in case of punching the tape carrier package 200 one by one from the carrier tape 1.

As shown in FIG. 1, a first integrated circuit device 201 and a second integrated circuit device 202 are provided to each of the tape carrier package 200. The first and the second integrated circuit device respectively 201 and 202 are mounted to each of the tape carrier package 200 by Tape Automated Bonding (TAB) method, for example. Although only two integrated circuit devices are illustrated in FIG. 1 for convenience, there may be three or more.

Furthermore as shown in FIG. 1, a plurality of input terminals 203 and a plurality of output terminals 204 are arranged in parallel at a regular interval on the tape carrier package 200. Although the plurality of input terminals 203 and the plurality of output terminals 204 are arranged at a regular interval along a direction to which the insulating tape 100 extends in FIG. 1, they may be arranged along a direction perpendicular to the direction to which the insulating tape 100 extends.

The first and the second semiconductor device respectively 201 and 202 are formed in rectangular shapes as in FIG. 1, provided with input and output pins to both sides of the rectangular shapes along with long sides thereof.

As shown in FIG. 1, the input pins of the first and the second semiconductor devices respectively 201 and 202 are placed on a side of the plurality of input terminals 203, while the output pins of the first and the second semiconductor devices respectively 201 and 202 are placed on a side of the plurality of output terminals 204. Each input pin is connected to a corresponding input terminal 203, similarly each output pin is connected to a corresponding output terminal 204.

As shown in FIG. 1, on the tape carrier package 200, a line 205 is formed for electrically connecting between the first and the second integrated circuit devices respectively 201 and 202, and the plurality of input terminals 203, as well as a line 206 for electrically connecting between the integrated circuit devices respectively 201 and 202, and the plurality of output terminals 204.

The plurality of input terminals 203, the plurality of output terminals 204, the lines 205 and 206 are patterned and formed using conductive material such as copper and gold foil.

The integrated circuit devices respectively 201 and 202, the lines 205 and 206 are coated with insular films (not shown). The input terminals 203 and the output terminals 204 are not coated with insular films (not shown) but the conductive material forming the input terminals 203 and the output terminals 204 are exposed.

In general, the plurality of output terminals 204 are connected to a drain or a source of a relatively large MOS transistor (not shown) inside the first and the second integrated circuit devices respectively 201 and 202. Further, the drain or the source of the MOS transistor is connected to a p-diffusion region on a n-well of a substrate. Because a withstanding pressure over static electricity of a transistor against electrostatic is high due to a junction capacitance of a pn junction.

Since an input protection circuit is generally provided to the plurality of input terminals 203 as well, measures against electrostatic discharge damage are usually applied to an input terminal.

However in a case of the first and the second semiconductor devices respectively 201 and 202 are arranged to be adjacent to each other as shown in FIG. 1, one of a semiconductor device (for instance 201) may be electrostatically charged to +1000V and another semiconductor device (for instance 202) may be electrostatically charged to −1000V. If the tape carrier package is punched in such condition, a pressing blade of a mold electrically contacts to form a discharging path, causing a high current to flow between the adjacent semiconductor devices 201 and 202.

The discharge occurring here is too high to be protected by a normal measure against electrostatic discharge damage, accordingly leading the adjacent semiconductor devices 201 and 202 to be damaged by electrostatic discharge.

It is possible to provide a protection device for high-current, however it increases a size of a semiconductor device and not a realistic measurement.

To overcome the problem, a connecting line 500 is provided for electrically short-circuiting only between one of the terminals for the first integrated circuit device 201 and one of the terminals for the second integrated circuit device 202 which is placed adjacent to the first integrated circuit 201, as shown in FIG. 1. The reason why the connecting line 500 is provided especially to a side of the input terminals 203 is that a power supply voltage and grounding voltage are applied only to a side of the input terminals 203.

On the other hand, all the output terminals 204 are usually signal terminals, thus mounting the connecting line 500 to a side of the output terminals 204 is unfavorable in comparison to mounting the connecting line 500 to the side of the input terminals 203.

The connecting line 500 is formed at the same time when patterning and forming the plurality of input terminals 203, the plurality of output terminals 204, the lines 205 and 206 using conductive material such as copper or gold foil By arranging the carrier tape 1 in the way described above, the first and the second integrated circuit device respectively 201 and 202 are electrically connected through the connecting line 500, thereby a potential between the first and the second integrated circuit device 201 and 202 being always kept to the same potential.

Accordingly it prevents integrated circuit devices 201 and 202 from being damaged by discharged static electricity during a process of manufacturing tape carrier package.

Each of the plurality of input terminals 203 and each of the plurality of output terminals 204 are not respectively short-circuited with each other.

It is therefore possible to conduct a performance test on an integrated circuit device, for example by applying a probe pin to the internal terminal 203 or the output terminal 204 to check for input/output of a signal. In other words, even when short-circuiting between the input terminals 203, a test signal can be inputted.

By using the carrier tape 1 according to the first embodiment of the present invention, it prevents the integrated circuit devices 201 and 202 from being damaged by discharged static electricity during a process of manufacturing tape carrier package, as well as allows to conduct a performance test on integrated circuit device for example by applying a probe pin to the input terminal 203 or the output terminal 204 to check for input/output of a signal.

Preferably one of the terminals for the first integrated circuit device 201 and one of the terminals for the second integrated circuit device 202 that is adjacent to the first integrated circuit 201 is respectively a power supply terminal or a ground terminal connected to a ground potential.

In such a case, a potential between the first and the second integrated circuit device respectively 201 and 202 can always be kept to the same potential more stably.

Depending on a performance test to the integrated circuit devices 201 and 202, terminals of the first and the second integrated circuit devices 201 and 202 to be connected to the connecting line 500 may be selected.

If three or more integrated circuit devices are provided to each of the tape carrier package 200, a connecting line may be formed in a way to connect only between one of the terminals of the integrated circuit device and one of the terminals of an adjacent integrated circuit device.

As shown in FIG. 1, the connecting line 500 is on the insulating tape 100 and provided outside a visible outline 400 of the tape carrier package 200.

Further, each of the tape carrier package 200 is punched one by one from the carrier tape 1 along with a cutting-plane line 300 from the carrier tape 1.

The cutting-plane line 300 is provided along with the visible outline 400 of the tape carrier package 200, as illustrated in FIG. 1. That is, the cutting-plane line 300 is overlapping with the visible outline 400 of the tape carrier package 200 in a plan view of the carrier tape 1.

After the tape carrier package 200 is cut along a cutting-plane line 300 off from the carrier tape 1, the tape carrier package 200 is connected to other electrical components such as a liquid crystal display panel by a connector connection or thermocompression bonding.

A process of cutting the tape carrier package 200 off from the carrier tape 1 is described hereinafter in detail with reference to the drawings.

Figure 2:
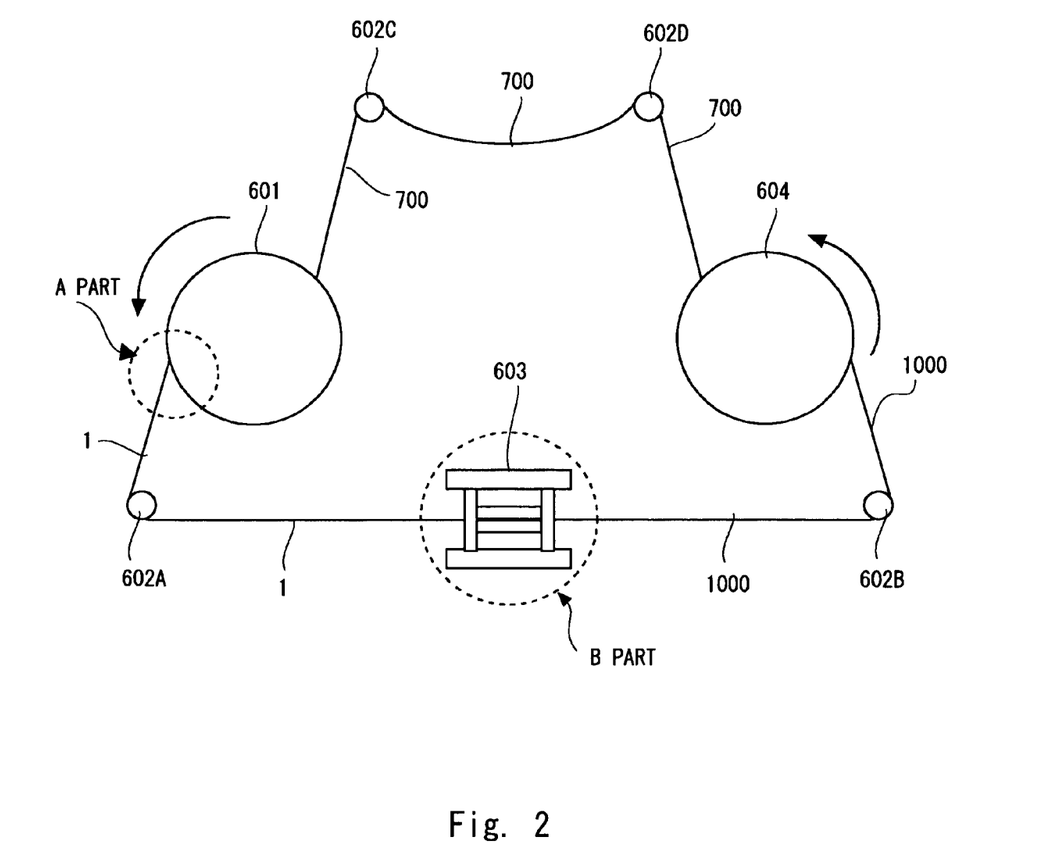
FIG. 2 is a view showing a tape path when cutting and separating a tape carrier package from a carrier tape.

FIG. 2 is a view showing a tape path when cutting and separating a tape carrier package from a carrier package.

As shown in FIG. 2, the carrier tape 1 is rolled together with a spacer tape 700 around a feeding reel 601 that spins in a direction indicated by an arrow, separated from the spacer tape 700 at A part (indicated by a dotted circle), fed through a role 602A, and the tape carrier package 200 is cut and separated by a mold 603 at B part (indicated by a dotted circle), which is a punching portion.

On the other hand a carrier tape 1000, in which the tape carrier packages 200 are cut and separated therefrom, is fed through a role 602B and rolled together with the spacer tape 700 which is fed through a role 602C and 602D, at a rolling reel 604 that spins in a direction indicated by an arrow.

B part, the punching portion indicated with dotted circle, includes a press mold 603 and a pressing cylinder (not shown). At the punching portion (B part), the pressing cylinder moves the press mold 603 up and down, the carrier tape 1 is fed intermittently by sprockets, and the tape carrier package 200 in the carrier tape 1 that is positioned by a positioning mechanism is cut along the cutting-plane line 300.

At this time, the connecting line 500 is on the insulating tape 100 and is provided outside the visible outline 400 of the tape carrier package 200. Thus a circuit configuration obtained after completing a cut and a separation of the tape carrier packages 200 is that an electrical connection between the first and the second integrated circuit device respectively 201 and 202 are disconnected therein.

The tape carrier package 200 cut, separated and retrieved is stored in a tray (not shown) provided under the press mold 603.

Figure 3:
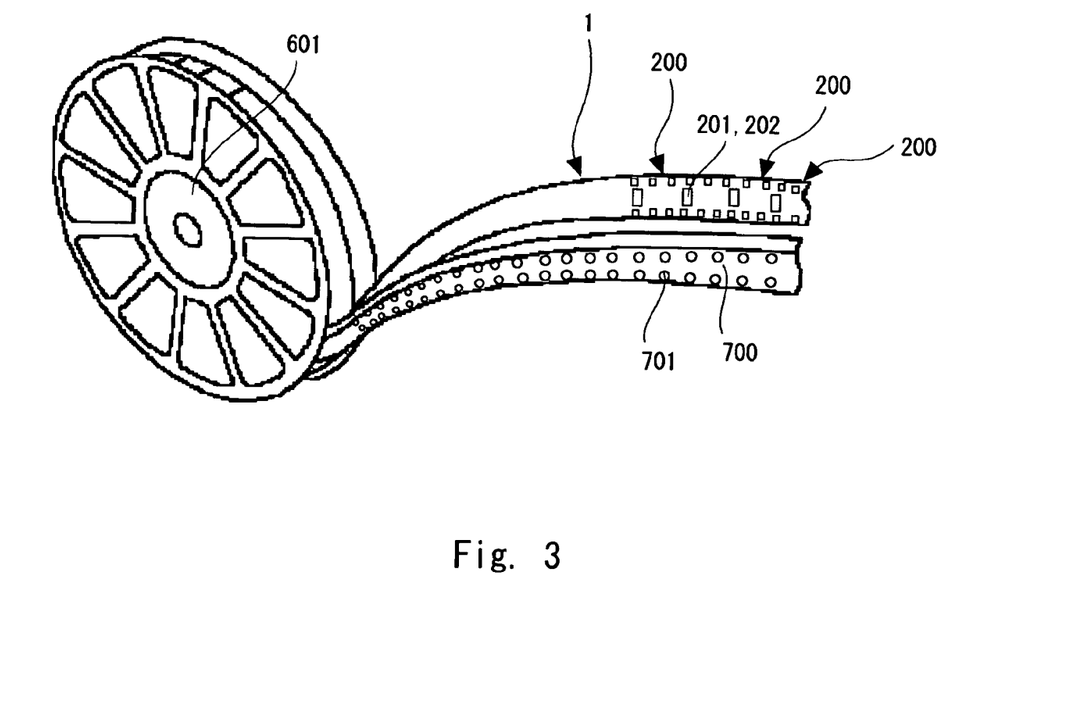
FIG. 3 is a perspective view showing a relationship between a carrier tape and a spacer tape.

FIG. 3 is a perspective view showing a relationship between a carrier tape and a spacer tape.

As shown in FIG. 3, a spacer tape 700 aligned with salient portions 701 on both sides thereof, which is formed by embossing, is rolled together with the carrier tape 1 so as to protect the integrated circuit devices 201 and 202 on the carrier tape 1.

As described in the foregoing, by electrically short-circuiting only between one of the terminals for the first integrated circuit device 201 and one of the terminals for the second integrated circuit device 202, a potential between the first and the second integrated circuit device respectively 201 and 202 can be kept to the same potential.

Accordingly A part, where the carrier tape 1 and the spacer tape 700 are separated when the feeding reel 601 indicated in FIG. 2 feeds, and B part, where the tape carrier package 200 is cut and separated from the carrier tape 1, are unsusceptible to static electricity generated, thereby preventing the integrated circuit devices 201 and 202 from being damaged.

In addition to this, one of the terminals for the first integrated circuit device 201 and one of the terminals for the second integrated circuit device are electrically short-circuited in this invention, and thus all of the plurality of input terminals 203 or output terminals 204 would not have the same potential.

Accordingly a performance test on an integrated circuit device can be conducted for example by applying a probe pin to the input terminal 203 and the output terminal 204.

The carrier tape 1 of the first embodiment prevents the integrated circuit devices 201 and 202 to be damaged by static electricity during a process of manufacturing tape carrier packages, as well as allows to conduct a performance test on the integrated circuit device for example by applying a probe pin to the input terminal 203 or the output terminal 204.

Figure 4:
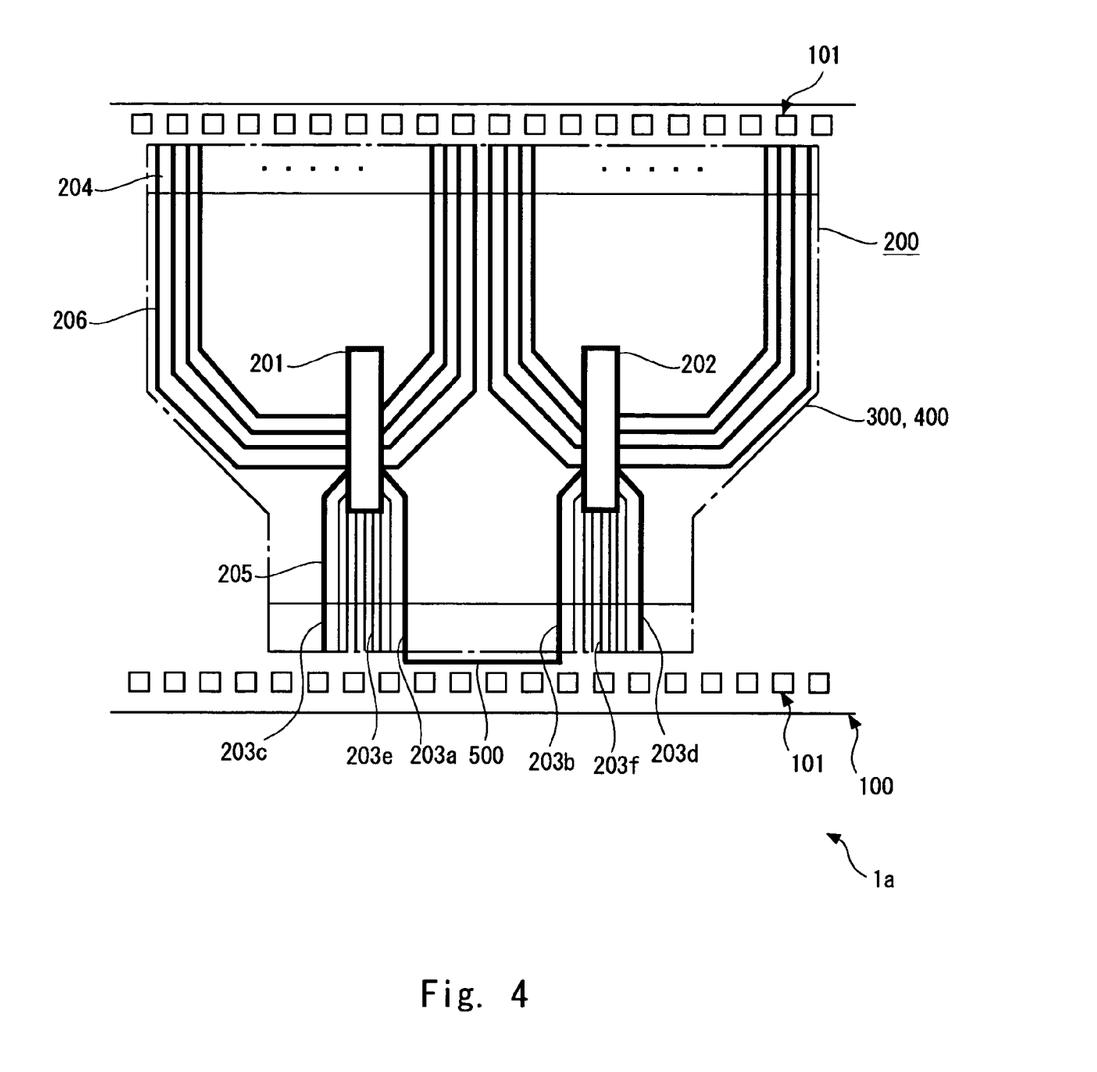
FIG. 4 is a plan view showing a configuration of a carrier tape according to a first embodiment of the present invention, and particularly for explaining a relation of connection between input terminals.

A relation of connection between input terminals 203 of the carrier tape 1 of the first embodiment is described hereinafter in detail. FIG. 4 is a plan view showing a configuration of a carrier tape according to the first embodiment of the present invention, and particularly for explaining a relation of connection between input terminals.

As shown in FIG. 4, input terminals 203 of the carrier tape 1 according to the first embodiment includes power supply terminals 203a and 203b, ground terminals 203c and 203d, and signal terminals 203e and 203f. The power supply terminal 203a, the ground terminal 203c, and the signal terminal 203e are connected to the first integrated circuit device 201, while the power supply terminal 203b, the ground terminal 203d, and the signal terminal 203f are connected to the second integrated circuit device 202.

As shown in FIG. 4, terminal width of the power supply terminal 203a and 203b, and ground terminals 203c and 203d is generally formed to be wider than terminal width of the signal terminals 203e and 203f. Because the power supply terminal may pass a stronger current than that of the signal terminal.

Input terminals connected with the connecting line 500 must be of the same type. That is, to connect the input terminals of the first integrated circuit device 201 with the input terminals of the second integrated circuit device 202 using the connection line 500, a connection needs to be established between any one of between the power supply terminal 203a and the power supply terminal 203b, between the ground terminal 203c and the ground terminal 203d, or between the signal terminal 203e and the signal terminal 203f. FIG. 4 shows an example where the power supply terminal 203a is connected with the power supply terminal 203b using the connecting line 500. A reason for this is explained with reference to FIG. 5.

Figure 5:
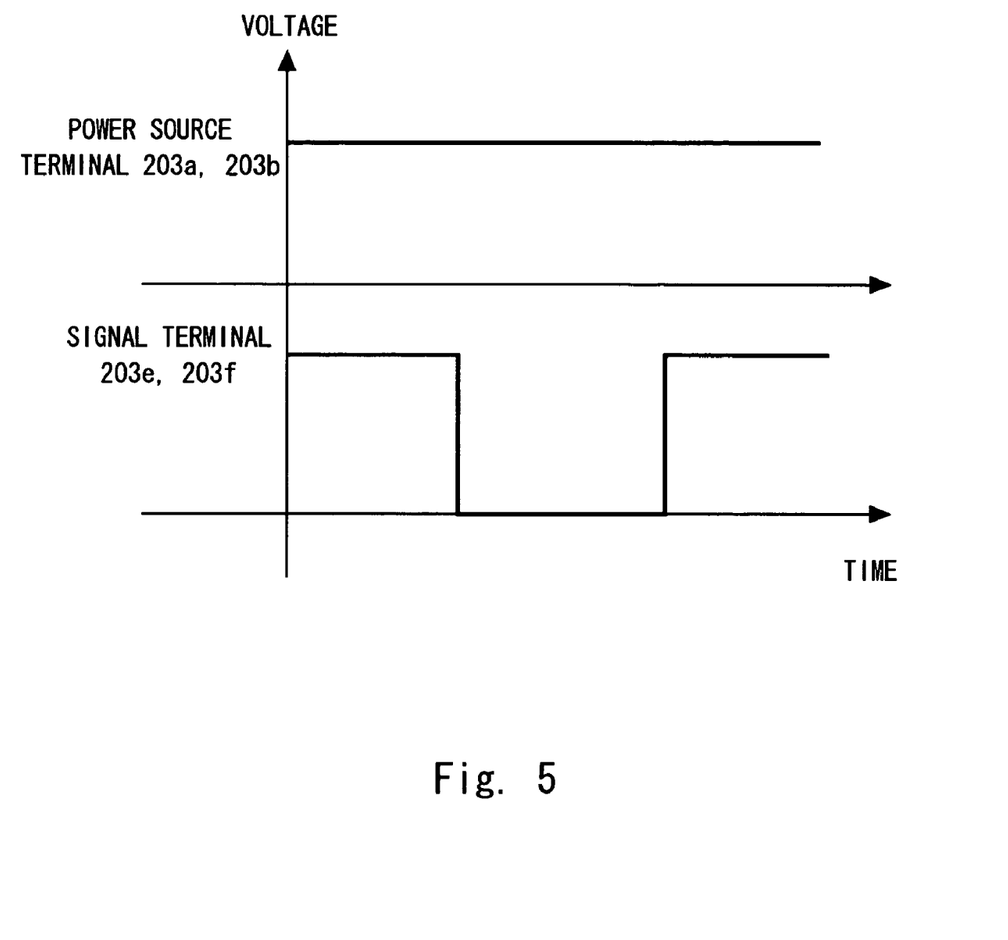
FIG. 5 is a view showing an example of a timing chart for power supply terminals and signal terminals.

FIG. 5 is a view showing an example of a timing chart for power supply terminals and signal terminals. As shown in FIG. 5, the power supply terminals 203a and 203b are always at a constant level, whereas the signal terminals 203e and 203f are not at a constant level. For this reason, in case of connecting input terminals with different timing patterns such as the power supply terminal 203a with the signal terminal 203f, it is not able to operate the first and the second integrated circuit devices 201 and 202, and not to be allowed to check input/output of signals. Accordingly as described above, to connect the input terminals of the first integrated circuit device 201 with the input terminals of the second integrated circuit device 202, a connection needs to be established between any one of between the power supply terminal 203a and the power supply terminal 203b, between the ground terminal 203c and the ground terminal 203d, or between the signal terminal 203e and the signal terminal 203f.

Second Embodiment

A configuration of a carrier tape according to a second embodiment of the present invention is described hereinafter in detail with reference to the drawing.

Figure 6:
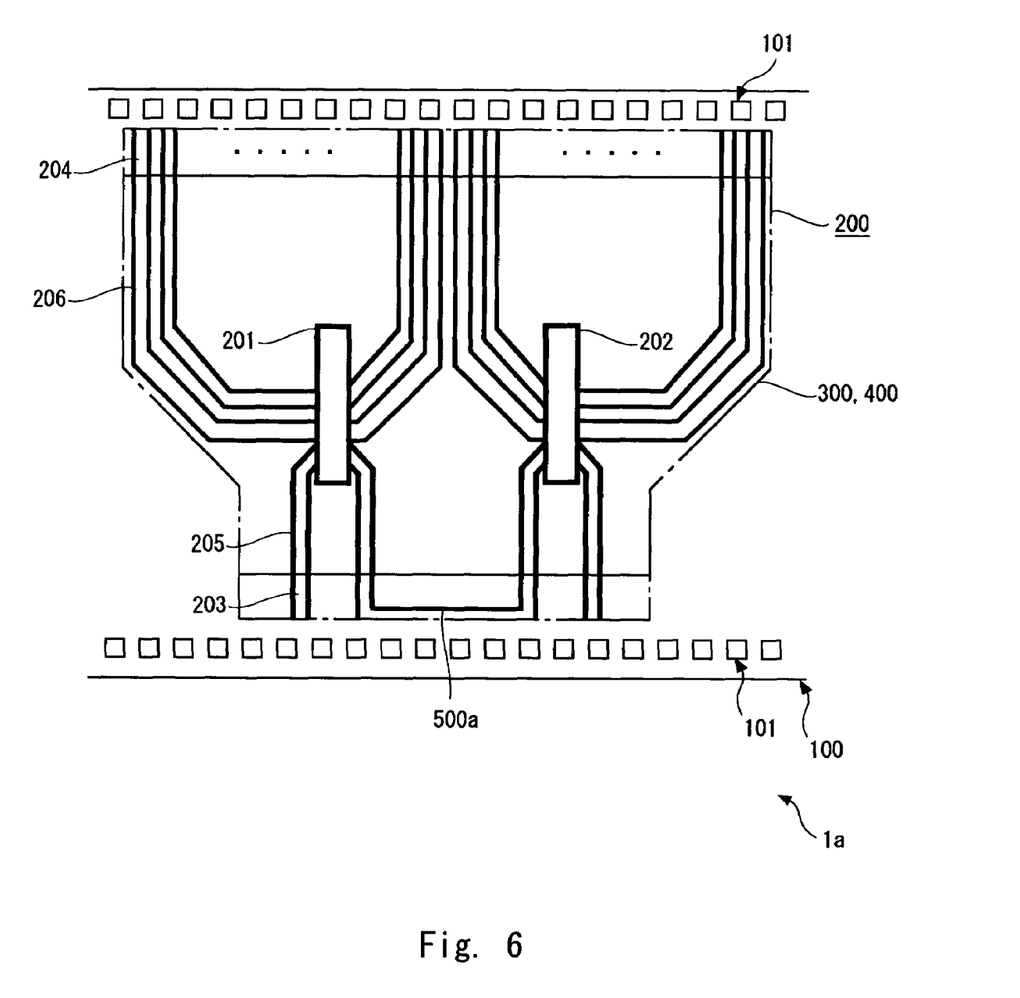
FIG. 6 is a plan view showing a configuration of a carrier tape according to a second embodiment of the present invention.

FIG. 6 is a plan view showing the configuration of the carrier tape according to the second embodiment of the present invention.

In the carrier tape 1 of the first embodiment, the connecting line 500 is on the insulating tape 100 and is provided outside the visible line 400 of the tape carrier package. On the other hand in a carrier tape 1a of the second embodiment as shown in FIG. 6 differs in a point that a connecting line 500a is on an insulating tape 100 but is inside a visible outline 400 of a tape carrier package 200.

In a cutting process of a carrier tape 1a of the second embodiment, at a punching portion (B part) illustrated in FIG. 2, the pressing cylinder moves the press mold 603 up and down, the carrier tape 1 is fed intermittently by the sprockets and positioned by a positioning mechanism, and the tape carrier package 200 in the carrier tape 1 is cut along the cutting-plane line 300.

At this time, the connecting line 500 is on the insulating tape 100 and is provided inside the visible outline 400 of the tape carrier package 200, as shown in FIG. 6. Thus in a circuit configuration obtained after cutting and separating the tape carrier package 200, the first and the second integrated circuit devices respectively 201 and 202 are electrically connected in the tape carrier package 200.

By using the carrier tape 1a of the second embodiment, similar effect as the carrier tape 1 of the first embodiment can be achieved. That is, the configuration of the second embodiment also prevents integrated circuit devices from being damaged by discharged static electricity during a process of manufacturing tape carrier package, as well as allows to conduct a performance test on integrated circuit device for example by applying a probe pin between terminals to check for input/output of a signal.

Figure 7:
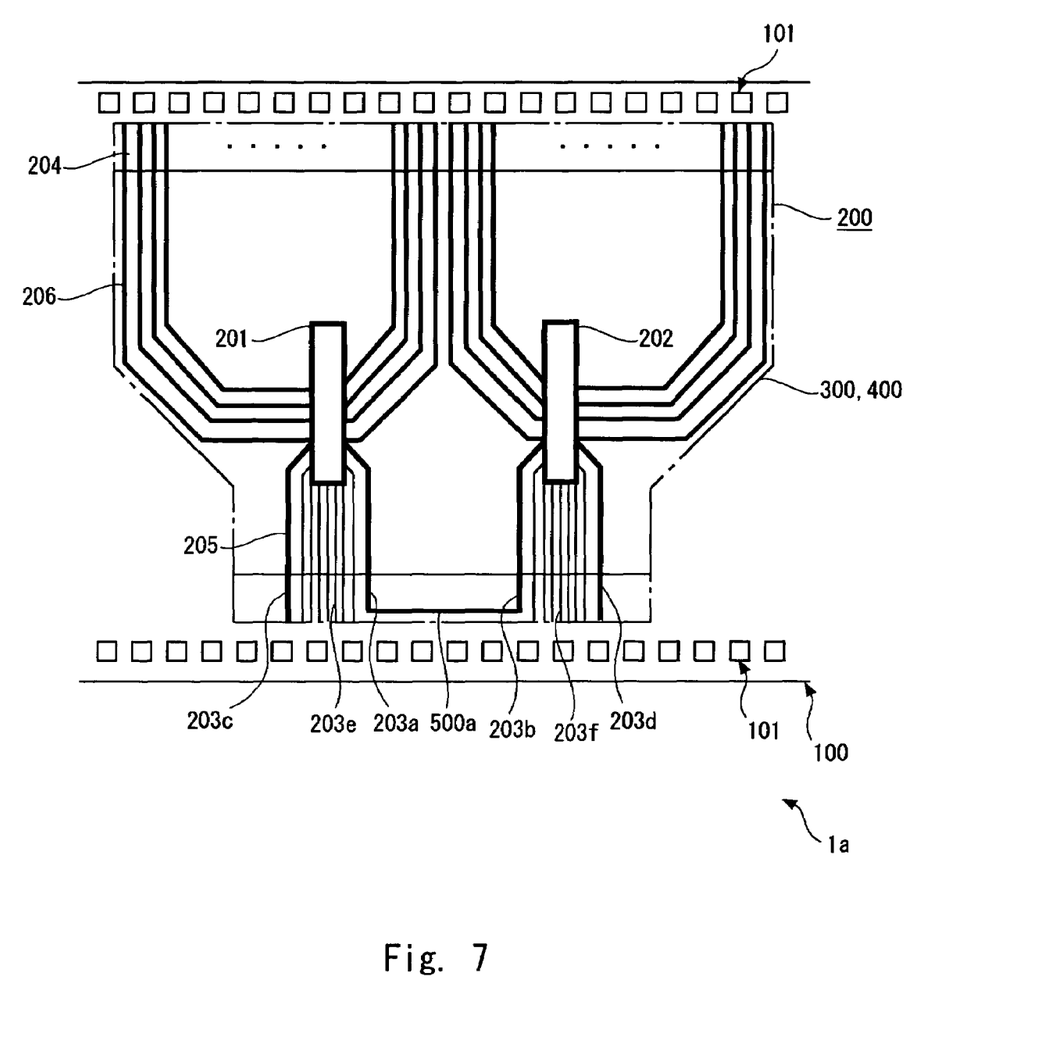
FIG. 7 is a plan view showing a configuration of a carrier tape according to the second embodiment of the present invention, and particularly for explaining a relation of connection between input terminals.

A relation of connection between input terminals 203 of the carrier tape 1a of the second embodiment is described hereinafter in detail. FIG. 7 is a plan view showing a configuration of a carrier tape according to the second embodiment of the present invention, and particularly for explaining a relation of connection between input terminals.

As shown in FIG. 7, input terminals 203 of the carrier tape 1a according to the second embodiment includes power supply terminals 203a and 203b, ground terminals 203c and 203d, and signal terminals 203e and 203f. The power supply terminal 203a, the ground terminal 203c, and the signal terminal 203e are connected to the first integrated circuit device 201, while the power supply terminal 203b, the ground terminal 203d, and the signal terminal 203f are connected to the second integrated circuit device 202.

As shown in FIG. 7, terminal width of the power supply terminal 203a and 203b, and ground terminals 203c and 203d is generally formed to be wider than terminal width of the signal terminals 203e and 203f. Because the power supply terminal may pass a stronger current than that of the signal terminal.

Input terminals connected with the connecting line 500a must be of the same type. That is, to connect the input terminals of the first integrated circuit device 201 with the input terminals of the second integrated circuit device 202, a connection needs to be established between any one of between the power supply terminal 203a and the power supply terminal 203b, between the ground terminal 203c and the ground terminal 203d, or between the signal terminal 203e and the signal terminal 203f. FIG. 7 shows an example where the power supply terminal 203a is connected with the power supply terminal 203b with the connecting line 500a. A reason for this is as explained with reference to FIG. 5.

Explanations in the foregoing are merely to describe the embodiments of the present invention and it is apparent that the present invention is not limited to the above embodiments. Further, a person skilled in the art will be able to easily change, add, or modify various elements of the above-described embodiments, without departing from the scope of the present invention.

In the above embodiment, it is explained that one of the terminals for the first integrated circuit device 201 and one of the terminals for the second integrated circuit device 202 are electrically short-circuited by the connecting lines 500 and 500a. However as long as not all the input terminals 203 of the first and the second integrated circuit devices 201 and 202 are connected to each other, a plurality of terminals of the first and the second integrated circuit devices 201 and 202 may be connected to each other.

It is apparent that the present invention is not limited to the above embodiment that may be modified and changed without departing from the scope and spirit of the invention.

What is claimed is:

1. A carrier tape comprising;
a plurality of tape carrier packages provided on an insulating tape,
wherein each tape carrier package comprises:
first and second integrated circuit devices provided to the tape carrier package, each of the first and second integrated circuit devices including a plurality of terminals,
a first one of the terminals of the first integrated circuit device being electrically connected to a first one of the terminals of the second integrated circuit device, a second one of the terminals of the first integrated circuit device being not electrically connected to a second one of the terminal of second integrated circuit device, and
a connecting line that connects only the first and second integrated circuit devices included in each tape carrier package,
wherein the connecting line is disposed on the insulating tape and provided outside an outline of each of the tape carrier packages and electrically connects the first one of the terminals of the first integrated circuit device only to the first one of the terminals of the second integrated circuit device, and
wherein the plurality of tape carrier packages are not electrically connected each other.

2. The carrier tape according to claim 1, wherein, in each tape carrier package, the first one of the terminals of the first integrated circuit device and the first one of the terminals of the second integrated circuit device are at the same potential.

3. The carrier tape according to claim 2, wherein, in each tape carrier package, the first one of the terminals of the first integrated circuit device and the first one of the terminals of the second integrated circuit device are power supply terminals.

4. The carrier tape according to claim 2, wherein, in each tape carrier package, the first one of the terminals of the first integrated circuit device and the first one of the terminals of the second integrated circuit device are ground terminals.

5. The carrier tape according to claim 2, wherein, in each tape carrier package, the first one of the terminals of the first integrated circuit device and the first one of the terminals of the second integrated circuit device are the terminals with the same function.

6. The carrier tape according to claim 2, wherein, in each tape carrier package, the first one of the terminals of the first integrated circuit device and the first one of the terminals of the second integrated circuit device have a first width that is wider than that of a second one of the terminals of the first integrated circuit device and the second one of the terminals of the second integrated circuit device.

7. The carrier tape according to claim 1, further comprising;
a cutting-plane line for cutting and separating each of a plurality of tape carrier packages along with the outline of the tape carrier package.

8. The carrier tape according to claim 1, wherein the insulating tape is polyimide.

9. The carrier tape according to claim 1, wherein input pins of the first and second integrated circuit devices are disposed along a first side of each of the tape carrier packages and output pins of the first and second integrated circuit devices are disposed along a second side of each of the tape carrier packages opposite to the first side of the tape carrier package.

10. A carrier tape comprising;
a plurality of tape carrier packages provided on a insulating tape,
wherein each tape carrier package comprises:
first and second integrated circuit devices provided to the tape carrier package, each of the first and second integrated circuit devices including a plurality of input terminals and output terminals, at least one of the input terminals of the first integrated circuit device being electrically connected to at least one of the input terminals of the second integrated circuit device, the output terminals of the first integrated circuit device being electrically connected to none of the output terminals of second integrated circuit device; and
a connecting line that connects only the first and second integrated circuit devices included in each tape carrier package,
wherein the connecting line is disposed on the insulating tape and provided outside an outline of each of the tape carrier packages and electrically connects the at least one of the input terminals of the first integrated circuit device only to the at least one of the input terminals of the second integrated circuit device, and
wherein the plurality of tape carrier packages are not electrically connected to each other.

11. The carrier tape according to claim 10, wherein, in each tape carrier package, a second one of the input terminals of the first integrated circuit device is supplied with a first potential, a second one of the input terminals of the second integrated circuit device is supplied with a second potential that is different from the first potential.

12. The carrier tape according to claim 10, wherein input pins of the first and second integrated circuit devices are disposed along a first side of each of the tape carrier packages and output pins of the first and second integrated circuit devices are disposed along a second side of each of the tape carrier packages opposite to the first side of the tape carrier package.

* * * * *